United States Patent [19]
Smith

[11] Patent Number: 6,134,505
[45] Date of Patent: Oct. 17, 2000

[54] TESTING ANALOG CIRCUITS USING SIGMA-DELTA MODULATORS

[75] Inventor: Malcolm Harold Smith, Macungie, Pa.

[73] Assignee: Lucent Technologies Inc., Murray Hill, N.J.

[21] Appl. No.: 08/861,289

[22] Filed: May 21, 1997

[51] Int. Cl.⁷ .............................................. G01R 31/3167
[52] U.S. Cl. ......................... 702/58; 702/117; 702/120; 702/126; 324/73.1; 714/30; 714/733
[58] Field of Search .................................. 702/58, 60–62, 702/64, 59, 117, 118, 120, 124, 126, 182–185, 189, 190, 197, 198, FOR 104, FOR 164, FOR 135; 324/74, 73.1, 142, 763; 708/313, 316; 710/69; 712/36; 341/77, 110, 155, 126, 122, 143, 180, 144; 332/101, 103, 117, 144, 127, 106; 714/25, 27, 30, 31, 37, 40, 45, 47, 48, 724, 733, 734, 732, 742

[56] References Cited

U.S. PATENT DOCUMENTS

| 5,226,001 | 7/1993 | Garverick | 708/313 |
|---|---|---|---|
| 5,345,409 | 9/1994 | McGrath et al. | 702/60 |
| 5,610,826 | 3/1997 | Whetsel | 702/117 |
| 5,627,536 | 5/1997 | Ramirez | 341/143 |
| 5,677,845 | 10/1997 | Staver et al. | 324/73.1 |

*Primary Examiner*—Hal Wachsman
*Attorney, Agent, or Firm*—Gibbons, Del Deo, Dolan Griffinger, & Vecchione

[57] ABSTRACT

An integrated circuit device has an analog block connected to a sigma-delta modulator. Analog signals from internal nodes in the analog block are fed to the sigma-delta modulator. The sigma-delta modulator produces digital representations of the analog signals. The digital representations are forwarded to a processor for analysis of the internal node signal. The above structure may be integrated within the framework of existing digital test structures to form a built-in self-test scheme.

17 Claims, 3 Drawing Sheets

TESTING ANALOG CIRCUITS USING SIGMA-DELTA MODULATORS

FIELD OF THE INVENTION

This invention relates to the field of integrated circuits, and more particularly to the testing of analog circuits.

BACKGROUND OF THE INVENTION

The quantity of functions incorporated on a semiconductor integrated circuit chip has dramatically increased over the years to such an extent that system designers are able to put entire systems on one integrated chip. These systems include both complex analog and digital circuits. As the level of complexity increases, the ability to provide reliable and comprehensive testing of the system on the chip also becomes difficult. Although improvements have been made in the testing of digital circuits and in the use of techniques which employ sigma-delta modulators to monitor direct current voltages on the chip, similar advancements have not been achieved in the testing of analog circuits.

Comprehensive testing of analog circuits equates to having the ability to monitor the internal nodes of the circuit on the chip. This is supported by the fact that some outputs do not necessarily change in response to a test signal. Therefore, it is generally important to test signal levels at these internal nodes. Prior art methods for testing internal nodes included routing the internal nodes off chip and monitoring them externally. Such prior art methods further include using analog shift registers or charged coupled devices to implement scan testing, where scan testing is defined by the shifting or scanning of a test signal or pattern through the system under test and producing a signature indicating proper or faulty operation of the circuit. One method of providing a test signal uses a sigma-delta modulator digital-to-analog converter to produce analog test signals from digital test signals stored on the chip.

Referring to FIG. 1, there is shown a prior art structure 100 for testing an analog circuit 105. Analog circuit 105 includes serially connected operational amplifiers 110. Output lines 112 from operational amplifiers 110 are routed to an internal analog multiplexer 115, which selectively provides one of the output lines 112 to a buffer amplifier 120 in response to a signal from a digital controller. The buffer amplifier analog output 130 is then routed off chip for testing via external analog test equipment.

Referring to FIG. 2, there is shown a prior art structure 200 for testing analog circuit 205 using a scan testing implementation. As before, analog circuit 200 includes serially connected operational amplifiers 210. In this scheme, a digital clock signal 215 clocks in an analog test signal 220 through a set of serially connected analog shift registers 230 and clocks out an analog output signal 240, which is fed to a buffer amplifier 250. The buffer amplifier analog output 260 is then again routed off chip for testing via external analog test equipment.

Each of the above mentioned techniques has several disadvantages. For example, an internal analog multiplexer circuit has to be used to route the internal nodes off chip, since there are a limited number of output pins. During the testing operation, the analog multiplexer circuit loads the analog circuit under test, thereby effecting the characteristics of the signal being tested. As such, this requires the utilization of a buffer amplifier to provide isolation. The prior art methods also require routing the analog test signals internally and off chip, and that the test signal be able to drive external analog testing equipment, which in turn increases the cost of the testing. In other prior art schemes, an internal analog-to-digital converter is utilized. This implementation has the added drawback of consuming generally large areas of valuable semiconductor area, which could be utilized for additional circuitry.

Accordingly, there is a need to provide an apparatus and method which overcomes the above disadvantages of the prior art, but still provides comprehensive and reliable testing of the analog circuits.

SUMMARY OF THE INVENTION

The present invention teaches a device which tests analog circuits by utilizing sigma-delta modulators to produce a digital representation of the analog signal. This approach permits the monitoring of internal nodes without requiring the routing of analog signals off the semiconductor chip. The device provides a comprehensive and reliable scheme which performs consistently over semiconductor device process variations. Importantly, the device of the present invention can be integrated within the framework of existing digital test structures of built-in self-test schemes.

In an exemplary embodiment of the present invention device, an integrated circuit has an analog block coupled to a sigma-delta modulator. The present scheme advantageously allows analog signals from internal nodes in the analog block to be fed to the sigma-delta modulator while decreasing the chances of corrupting the data at the internal nodes. Since the sigma-delta modulator produces a digital representation of the analog signal, the use of expensive external analog test equipment is not necessary. Consequently, the present invention provides a digital test compatible scheme for testing signal operability at various internal points in the analog circuit.

Advantageously, the structure of the present invention limits loading on the internal nodes of the analog circuit and simplifies the design of any required buffer amplifiers. By utilizing the sigma-delta modulator to digitize the signal, the present structure eliminates routing analog signals across the semiconductor device to drive analog test equipment. Importantly, the digital signal can be forwarded to a digital signal processor for analysis of the internal signal. Thus the present scheme makes the analog test portion compatible with the digital test portion. The above factors make the present invention particularly useful for integrated circuit devices having mixed signal applications and employing digital signal processors.

BRIEF DESCRIPTION OF THE DRAWINGS

A more complete understanding of the present invention may be obtained from consideration of the following description in conjunction with the drawings in which.

DETAILED DESCRIPTION

The present invention is a device which tests analog circuits by utilizing sigma-delta modulators to produce a digital representation of the analog signal. This approach permits the monitoring of internal nodes to provide a comprehensive and reliable testing scheme which performs consistently over semiconductor device process variations. Importantly, the device of the present invention can be integrated within the framework of existing digital test structures of built-in self-test schemes. The present invention is especially useful for integrated circuit devices having mixed signal applications and employing digital signal processors.

In one advantageous embodiment, the present invention is an integrated circuit which includes an analog block coupled to a sigma-delta modulator. This structure allows analog signals from internal nodes in the analog block to be fed to the sigma-delta modulator while decreasing the chances of corrupting the data at the internal nodes. Since the sigma-delta modulator produces a digital representation of the analog signal, expensive external analog test equipment is not necessary. Importantly, the digital signal could be forwarded to an on-board digital signal processor for analysis of the internal signal as part of a built-in self-test configuration.

Figure 1:
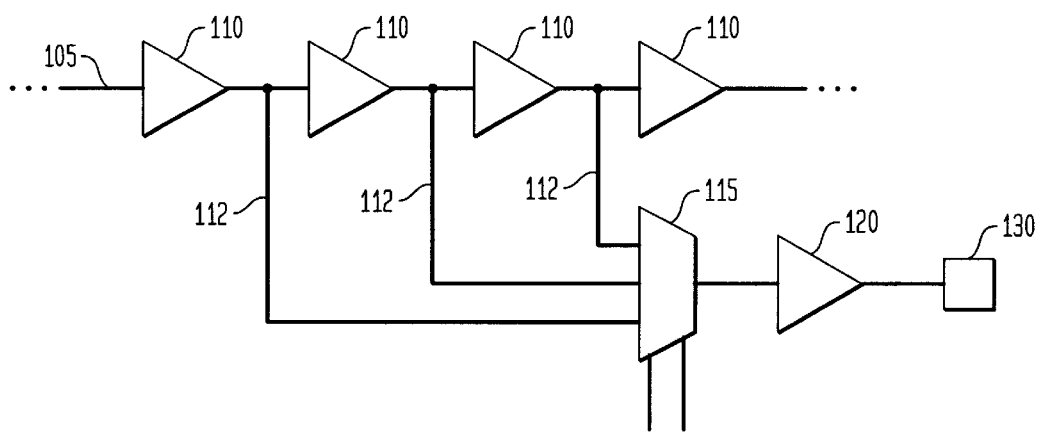
FIG. 1 is a prior art device for testing analog circuits.
Figure 2:
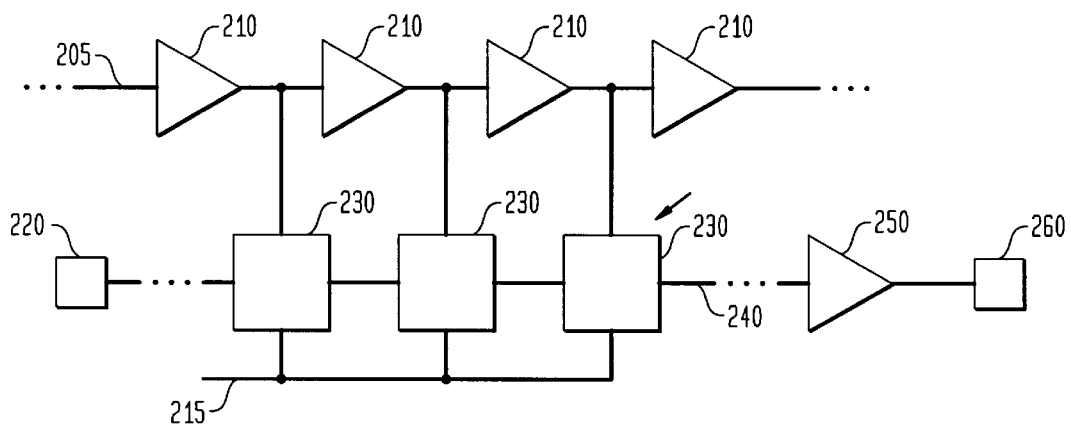
FIG. 2 is another prior art device for testing analog circuits.
Figure 3:
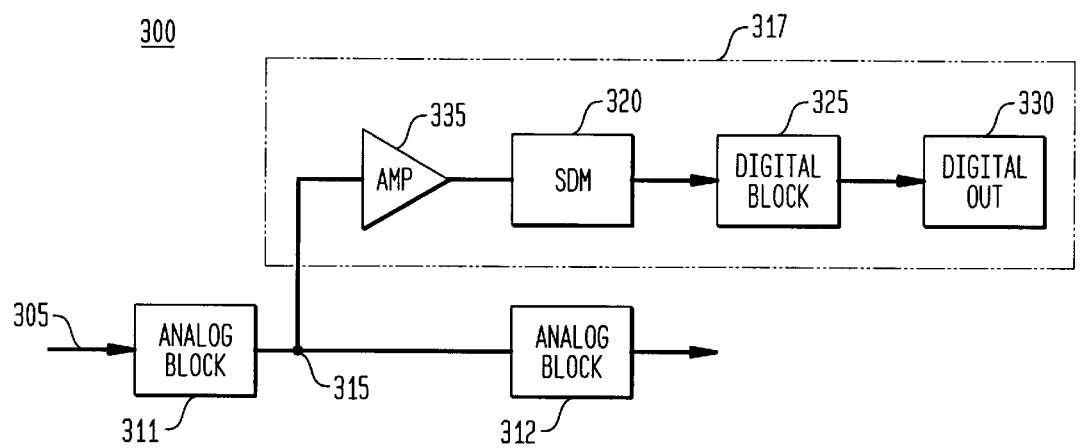
FIG. 3 is a block diagram of a testing device in accordance with the present invention.

Referring to FIG. 3, an exemplary embodiment is shown of an integrated circuit 300 in accordance with the teachings of the present invention. Integrated circuit 300 includes the analog circuits to be tested, namely first analog block 311 and second analog block 312, as well as test circuitry 317. As would be understood, test circuitry 317 could be located on-board as part of a built-in self-test scheme or located off chip. Analog blocks 311 and 312 may represent one or more analog circuits which include active analog elements, such as, operational amplifiers, comparators and other analog circuit elements, as well as passive components. Although two analog blocks are shown, it would be understood that the number of analog blocks is limited only by the physical dimensions of the semiconductor chip. As would also be understood, an analog test signal is applied at an input terminal 305 of the analog block to be tested from a test source.

In accordance with the present invention, an internal node to be tested, for example, internal node 315, has an associated analog signal routed to a sigma-delta modulator 320. Sigma-delta modulator 320 transforms the analog signal to a digital signal by converting the analog signal to a digital pulse string having an average amplitude over time proportional to the input analog signal. The digital signal is then directed to and easily utilized by a digital block 325, which in this instance routes the digital signal to a digital output pin 330 for testing using external test circuitry. An optional buffering amplifier circuit 335 can be placed between the selected internal node and the sigma-delta modulator when the sensitivity of the internal node being tested is such that the characteristics of the signal are affected. However, unlike prior art schemes, the design of buffering amplifier circuit 335 is simplified since the analog signal is not required to drive any external analog test equipment.

Figure 4:
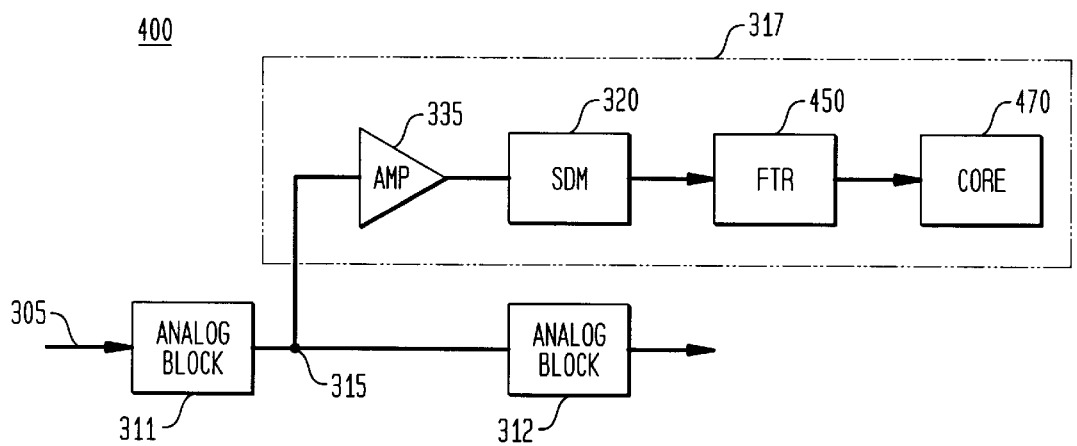
FIG. 4 is a block diagram of another testing device in accordance with the present device.

Referring now to FIG. 4, another embodiment is shown of an integrated circuit 400 in accordance with the teachings of the present invention. For purposes of clarity, like numbered items are defined as above for integrated circuit 300. Integrated circuit 400 includes a finite impulse response filter 450 which is coupled to the digital output side of sigma-delta modulator 320. A digital signal processing core 470 is connected to the other end of finite impulse response filter 450. As shown below, this additional circuitry makes it possible to perform the analysis of the internal node signals on the chip itself.

As in the embodiment of FIG. 3, sigma-delta modulator 320 converts an analog input signal and outputs a digital output signal that is proportional to the analog input signal. However, the output rate of the digital data from sigma-delta modulator 320 is generally higher than the data rates at which digital signal processing core 470 is best suited to handle. As a consequence, the output of sigma-delta modulator 320 is fed to finite impulse response filter 450 to undergo a process termed decimation. Decimation reduces the digital data rate produced by a sigma-delta modulator to a rate better utilizeable by a digital signal processing core. Although, a standard means for implementing the decimation process is to use a finite impulse response filter, other means could also be used. In effect, finite impulse response filter 450 is used to shape the digital signal before forwarding it to digital signal processing core 470, where signal processing operations like fast fourier transforms can be performed on the signal.

Figure 5:
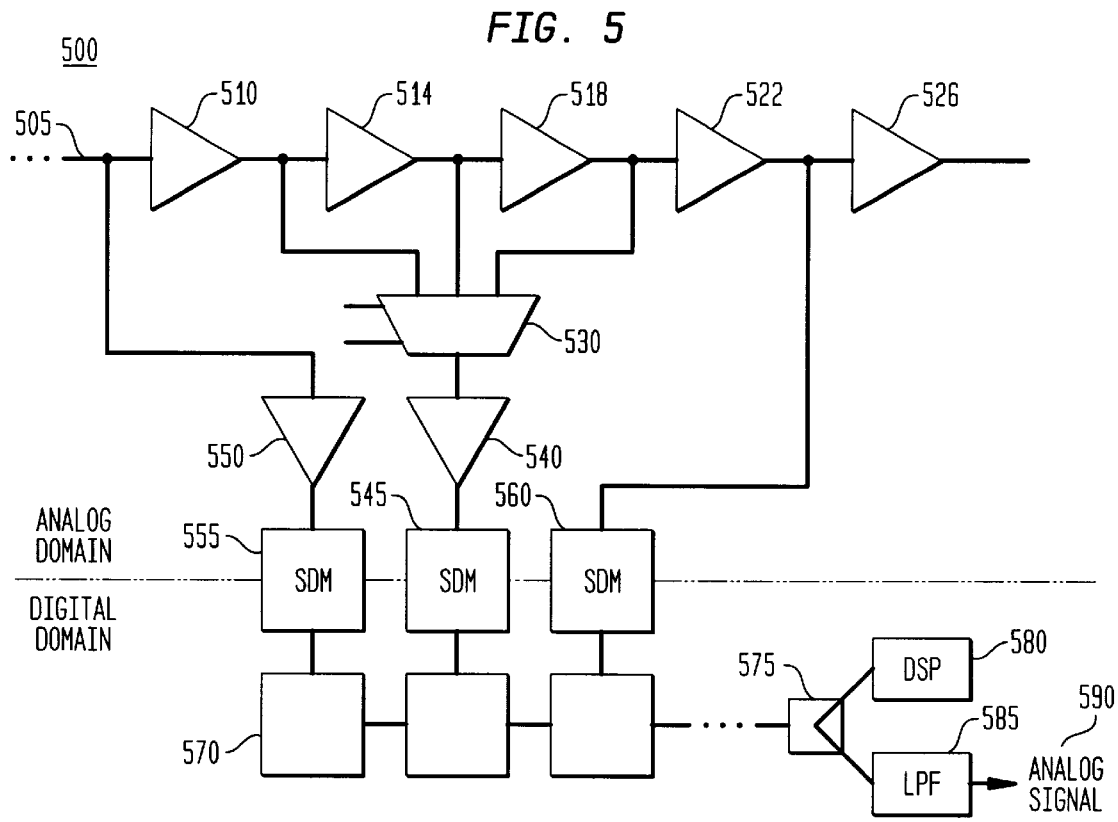
FIG. 5 is a block diagram of another testing device which utilizes multiple sigma-delta modulators in accordance with the present invention.

Referring now to FIG. 5, an exemplary embodiment is shown of an integrated circuit 500 which employs multiple sigma-delta modulators in accordance with the teachings of the present invention. Integrated circuit 500 has an analog circuit 505 which includes, for example, serially connected operational amplifiers 510, 514, 518, 522 and 526. In this embodiment, internal node analog signals are routed either through an analog multiplexer 530 with digital control signals, through a buffering amplifier circuit 540 and to a sigma-delta modulator 545, or through a buffering amplifier circuit 550 and then to a sigma-delta modulator 555 or straight to a sigma-delta modulator 560. The arrangement of the routing is dependent upon the space available on the semiconductor chip and the ease and efficiency of implementation. As explained above, sigma-delta modulators 545, 555 and 560 convert the analog signal to a digital signal for analysis by an analysis block.

In this embodiment, a digital scan path is utilized to clock in a test signal and output the selected internal node signal to a digital output pin 575. The digital signal can then be analyzed using a digital signal processing core 580 or be taken off-chip and be analyzed with external digital test equipment or a processor running digital processing software. Alternatively, the digital signal can be fed through a low pass filter 585 to produce an analog signal 590, which can then be analyzed using external analog test equipment. As shown, the present embodiment permits both digital and analog testing of the internal node. However, the analog signal does not have to be routed through the chip and need not be able to drive the external analog testing equipment. As detailed above, the internal analog signal is routed digitally and then, if necessary, converted to the analog signal.

Figure 6:
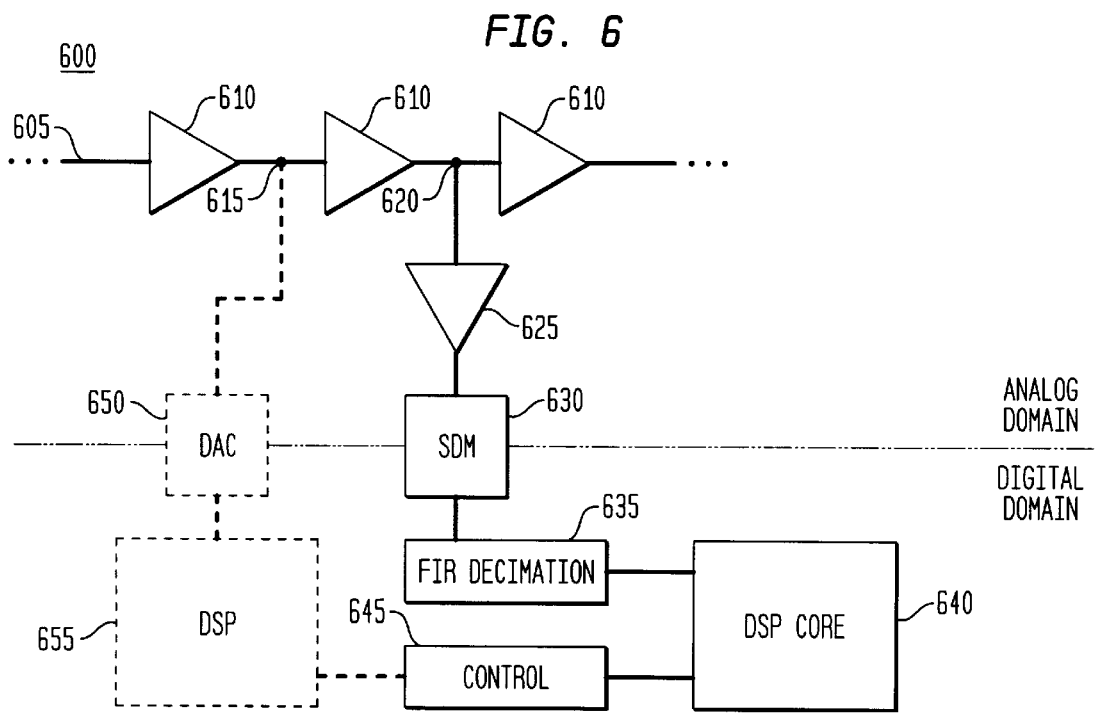
FIG. 6 is a block diagram of another testing device utilizing a built-in self-test architecture in accordance with the present invention.

Referring now to FIG. 6, an exemplary embodiment is shown of an integrated circuit 600 implementing a built-in self-test scheme in accordance with the teachings of the present invention. A built-in self-test scheme permits comprehensive and reliable testing of the integrated circuit on the semiconductor chip without relying upon external equipment or test signals. Integrated circuit 600 has an analog circuit 605, for example, which includes serially connected operational amplifiers 610. As before, an analog signal from an internal node, for example node 620, is fed to a sigma-delta modulator 630 through optional buffering amplifier circuit 625. The resulting digital signal is then fed to a finite impulse response filter 635 before being routed to a digital signal processing core 640 for analysis. In this embodiment, the input test signal to operational amplifiers 610 is provided by an on chip source, specifically digital signal processor 655. A test signal is digitally stored in memory associated with digital signal processor 655 and routed to a digital-to-analog converter 650 when directed to by a control unit 645. The input test signal is fed to an input terminal 615 of operational amplifier 610 in analog form. As such, all required test signals and signal analysis can be performed on the chip without external support.

Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention. Details of the structure may be varied substantially without departing from the spirit of the invention and the exclusive use of all modifications which come within the scope of the appended claim is reserved.

What is claimed is:

1. An integrated circuit having a test circuit for analyzing circuit operability at various points on the integrated circuit, comprising:

at least one analog block having at least one internal node for providing an analog signal;

at least one sigma-delta modulator coupled to said various points on the integrated circuit for producing a digital representation of said analog signal;

an analysis block responsive to said digital representation for analyzing said digital representation; and a buffering amplifier circuit disposed between said at least one internal node and said at least one sigma-delta modulator.

2. The integrated circuit according to claim 1, wherein said analysis block further includes:

a decimation means connected to a digital output terminal of said at least one sigma-delta modulator for producing a lower data rate digital signal; and a digital signal processor connected to an output of said decimation means for analyzing said digital signal.

3. The integrated circuit according to claim 1, wherein said analysis block further includes:

a digital filter connected to a digital output terminal of said at least one sigma-delta modulator for conditioning said digital representation; and a digital signal processor connected to an output of said digital filter for analyzing said digital representation.

4. The integrated circuit according to claim 3, wherein said digital filter is a finite impulse response filter.

5. The integrated circuit according to claim 4, further including means for providing a test signal to an input terminal associated with said at least one internal node.

6. The integrated circuit according to claim 5, wherein said means for providing a test signal includes:

a test signal processor having an associated memory for storing at least one digital test signal;

a digital-to-analog converter coupled to said test signal processor and to said input terminal; and a control unit connected to said test signal processor and said digital signal processor, wherein said digital-to-analog converter converts said at least one digital test signal supplied from said test signal processor to an analog test signal and route said analog test signal to said input terminal when said control unit sends a test control signal.

7. The integrated circuit according to claim 1, wherein said analysis block includes a digital analysis block and an analog analysis block, the integrated circuit further comprising a filter operable to convert said digital representation to an analog test signal, the analog analysis block being operable to analyze the analog test signal.

8. The integrated circuit according to claim 1, further including an analog multiplexer positioned between said at least one internal node and said at least one sigma-delta modulator.

9. The integrated circuit according to claim 8, further including a buffering amplifier circuit positioned between said analog multiplexer and said at least one sigma-delta modulator.

10. A method for analyzing operability of an integrated circuit, comprising:

providing a first analog signal from an internal node of an analog circuit, said analog circuit being integral with said integrated circuit;

converting said first analog signal to a digital signal that is proportional to said first analog signal using a sigma-delta modulator; and routing said digital signal to an analysis block, wherein said step of providing includes the step of routing said first analog signal through a buffering amplifier circuit before going to said sigma-delta modulator.

11. The method according to claim 10, wherein said step of providing includes the step of routing said first analog signal through an analog multiplexer before going to said sigma-delta modulator.

12. The method according to claim 10, wherein said step of routing said digital signal to an analysis block further includes the steps of:

pre-processing said digital signal to produce a shaped digital signal;

routing said shaped digital signal to a digital signal processor; and analyzing said shaped digital signal with said digital signal processor.

13. The method according to claim 12, wherein said step of pre-processing includes the step of reducing a data rate of said digital signal to a lower data rate digital signal.

14. The method according to claim 10, further including the steps of:

obtaining a digital test signal from a test signal processor in response to a command from a control unit;

converting said digital test signal to an analog test signal; and applying said analog test signal to an input terminal associated with said internal node, wherein said step of routing includes the steps of:

filtering said digital signal;

sending the filtered digital signal to a digital signal processor; and analyzing said filtered digital signal.

15. The method of claim 10, wherein said analysis block includes a digital analysis block and an analog analysis block, the method further comprising the step of converting said digital signal to a second analog signal, the analog analysis block being operable to analyze the second analog signal.

16. An integrated circuit having a test circuit for analyzing circuit operability at various points on the integrated circuit comprising:

at least one internal test node for providing a first analog signal;

at least one sigma-delta modulator for receiving said first analog signal and outputting a digital signal that is proportional to said first analog signal;

a storage processor for providing a digital test signal to a digital-to-analog converter in response to a control signal from a control unit;

said digital-to-analog converter converting said digital test signal to an analog test signal and providing said analog test signal to an input terminal associated with said at least one internal test node; and an analysis section, said at least one sigma-delta modulator routing said digital signal to said analysis section, said analysis section providing digital and analog analysis, wherein said analysis section includes a digital block for analyzing said digital signal from said at least one sigma-delta modulator, wherein said storage processor, said digital-to-analog converter, and said digital block form a built-in self-test unit for said integrated circuit.

17. The integrated circuit according to claim 16, wherein said analysis section includes an analog analysis block, further including a filter operable to convert said digital signal to a second analog signal, the analog analysis block being operable to analyze the second analog signal.

* * * * *